United States Patent [19]

Delvecchio et al.

[11] Patent Number: 4,599,591

[45] Date of Patent: Jul. 8, 1986

[54] MAGNETOSTRICTIVE TRANSDUCER

[75] Inventors: Robert M. Delvecchio, Sunnyvale, Calif.; Karl Foster, Forest Hills Boro, Pa.

[73] Assignee: Westinghouse Electric Corp., Pittsburgh, Pa.

[21] Appl. No.: 731,697

[22] Filed: May 8, 1985

[51] Int. Cl.$^4$ ............................................. H01F 7/00
[52] U.S. Cl. ................................................ 335/215
[58] Field of Search ....................... 361/206; 335/215; 336/20

[56] References Cited

U.S. PATENT DOCUMENTS

| | | | |
|---|---|---|---|
| 3,783,505 | 1/1974 | Schoen, Jr. | 335/215 X |
| 3,861,203 | 1/1975 | Dahle et al. | 335/215 |
| 4,397,381 | 8/1983 | Fisher et al. | 335/215 X |

Primary Examiner—Michael L. Gellner
Attorney, Agent, or Firm—D. Schron

[57] ABSTRACT

A magnetostrictive transducer utilizing magnetostrictive material and a plurality of windings connected to current sources having a phase relationship so as to establish a rotating magnetic induction vector within the magnetostrictive material.

18 Claims, 16 Drawing Figures

FIG. 7
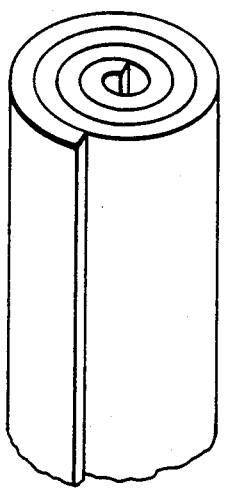
FIG. 8
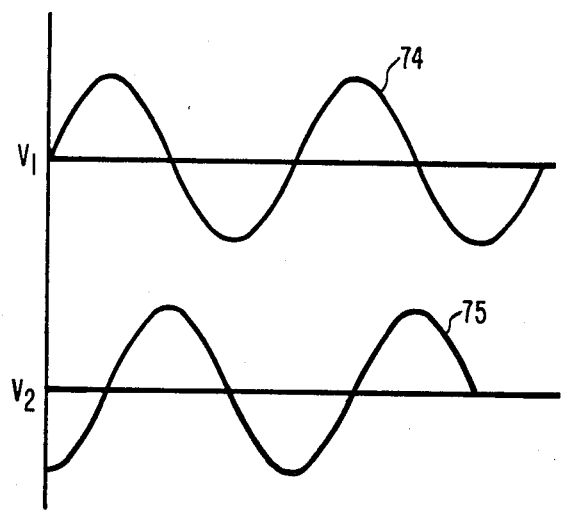
FIG. 9
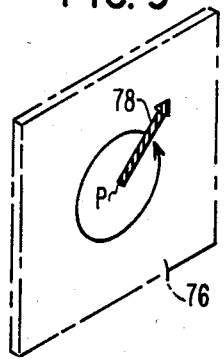
FIG. 10
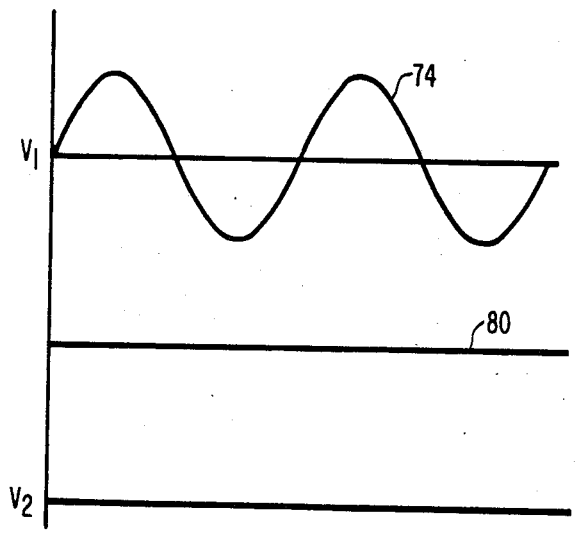
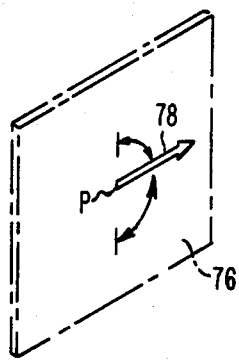
FIG. 11

MAGNETOSTRICTIVE TRANSDUCER

BACKGROUND OF THE INVENTION

Magnetostrictive transducers are used extensively for industrial and medical applications as well as for underwater acoustics wherein the transducer often serves as both a sound source and receiver.

The transducers are fabricated utilizing a magnetostrictive material which changes its dimension when exposed to a magnetic field generated by supplying current to a coil of wire surrounding the material. Conversely, a change in length of the material, as may be caused by an impingement of an acoustic signal, will create a corresponding electric signal in the coil for detection purposes.

In order to achieve satisfactory magnetostrictive action, various candidate materials must undergo a multitude of manufacturing processes such as magnetic annealing, rolling, re-annealing, etc., in order to orient the magnetic domains of the material in a preferred direction. Other transducer materials require the constant application of a stress to achieve the preferred domain orientation and loss of the applied stress during use results in transducer inoperability.

The transducer of the present invention can operate using the above materials but can also be made to operate satisfactorily with non-oriented and unstressed materials. It can also be operated in such a manner as to fully utilize the magnetostrictive potential of any material.

SUMMARY OF THE INVENTION

The transducer is comprised of an assembly including magnetostrictive material having one or more magnetic domains. Means are provided for establishing a varying magnetic field of a type to generate within the magnetostrictive material, a magnetic induction which rotates to induce magnetostrictive domain movement. Mechanical coupling means connected to the assembly transfers magnetostrictive movement of the material for the transducer's intended operation.

BRIEF DESCRIPTION OF THE DRAWINGS

FIG. 7 is a preferred arm construction of the transducer of FIG. 6;

FIG. 8 illustrates the relationship of the signals utilized in the embodiment of FIG. 6;

FIG. 9 depicts an elemental portion of the transducer of FIG. 6 and the rotational magnetic induction therein generated in response to the waveforms of FIG. 8;

FIG. 10 illustrates alternate signals which may be utilized with the transducer of FIG. 6;

FIG. 11 illustrates an elemental portion of the transducer of FIG. 6 and the movement of the induction vector in response to the waveforms of FIG. 10;

DESCRIPTION OF THE PREFERRED EMBODIMENT

Figure 1:
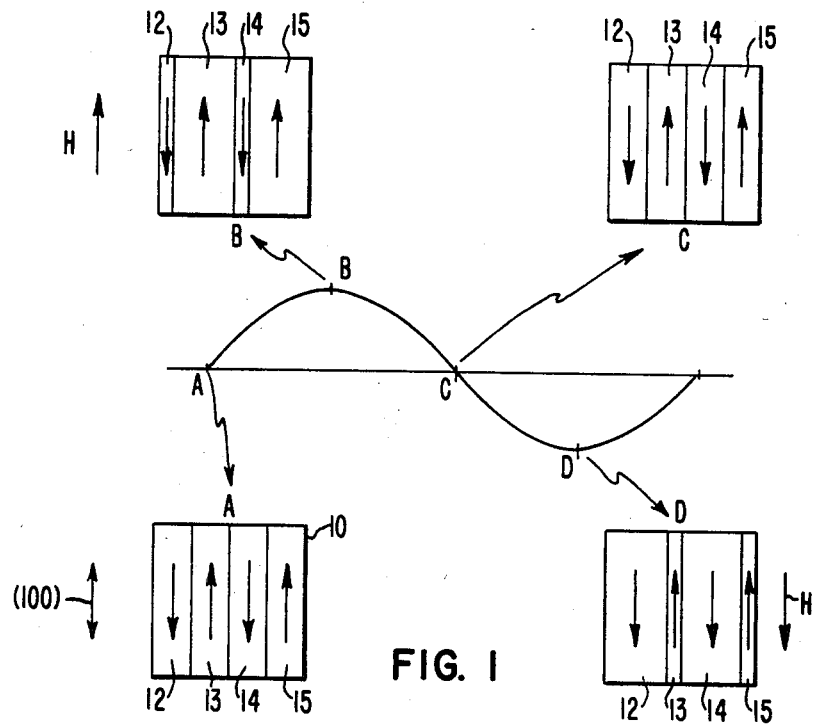
FIG. 1 serves to depict magnetic domain wall movement of a first type in response to an applied field.

In FIG. 1 numeral 10 is a simplified representation of an elemental sample of magnetostrictive material such as a single crystal of iron. The sample has been processed such that its magnetic domains 12, 13, 14 and 15 are oriented in the direction of easy magnetization of the material, <100> for iron. The arrows within the domains are magnetization, or domain vectors.

If a varying magnetic field is applied to the sample in the direction of easy magnetization, and as might be generated by sinusoidal waveform 20, movement of the domain walls will take place. At point A in the waveform, a zero magnetic field exists and accordingly, all of the domains are of the same size. An increase of the magnetic field in the direction of the arrow H causes domain wall movement such that, at maximum point B, domains 13 and 15, having their domain vectors in the same direction as the magnetic field H, are of a maximum width whereas domains 12 and 14, having oppositely directed domain vectors, are of a minimal width. At point C the domain structure reverts to that initial structure of point A while at point D domains 12 and 14, having their domain vectors in the same direction as the magnetic field H, have increased to maximum width at the expense of domains 13 and 15.

The domain vectors of adjacent domains are 180° apart, directionally, with respect to one another and accordingly, the wall between them is known as a 180° wall. 180° wall movement as depicted in FIG. 1 produces no magnetostrictive action of the sample.

Figure 2A:
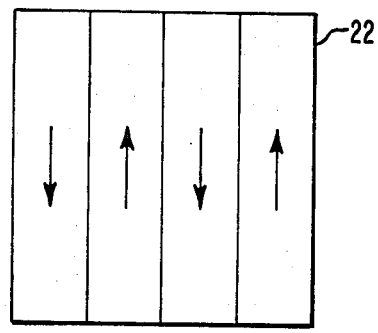
FIGS. 2A and 2B and 3A to 3C serve to illustrate other types of domain wall movement.
Figure 2B:
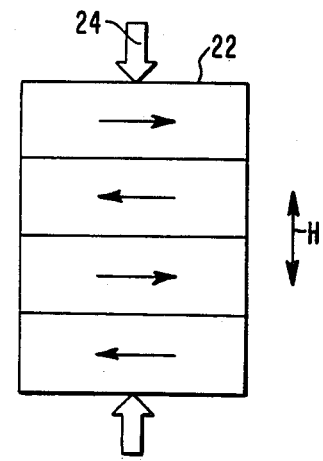

If a sample 22 as in FIG. 2A is stressed, as indicated by heavy arrows 24 in FIG. 2B, the effect in many magnetic materials will be to reorient the domains from that of FIG. 2A to that in FIG. 2B. Thereafter, application of a magnetic field in the direction of double-ended arrow H will cause rotation of the domain vectors into and out of the field direction. Such rotational action is desired and will produce a magnetostrictive effect.

Figure 3A:
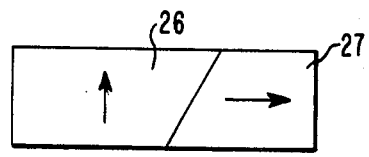
Figure 3B:
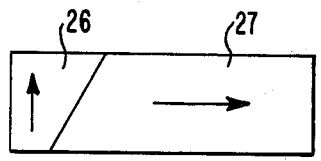
Figure 3C:
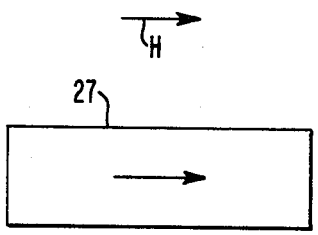

A third type of movement is illustrated in FIGS. 3A to 3C. In FIG. 3A numerals 26 and 27 represent adjacent domains having their domain vectors at an angle other than 180° with respect to one another. For simplicity the wall between the domains is known as a 90° wall, although the domain vectors may be at angles other than the 90° illustrated in FIG. 3A. Application of a magnetic field in the direction as indicated by arrow H in FIG. 3B will cause domain 27 to grow at the expense of domain 26. On an opposite half-cycle domain 27 will shrink, with the repetitive action in the presence of a weak or moderate magnetic field resulting in magnetostrictive action. If a strong field is applied, as indicated by the longer arrow H in FIG. 3C, the effect will be to create a single domain with the process being known as saturation.

The present invention is operable with a great variety of magnetostrictive materials either highly oriented or not oriented and either crystalline or amorphous materials. For those materials exhibiting zero or very low anisotrophy, that is, no preferred direction of magnetization, operation of the transducer of the present invention is preferably conducted at saturation conditions thereby allowing greater magnetostrictive action by taking advantage of the full magnetostrictive effect throughout the entire volume of magnetostrictive material. Additionally, since there are no domain walls nor domain wall movement at saturation, losses due to domain wall movement, for example, hysteresis losses, are eliminated. For relatively high anisotrophic materials, magnetostrictive action is primary by 90° wall movement at low fields.

Figure 4:
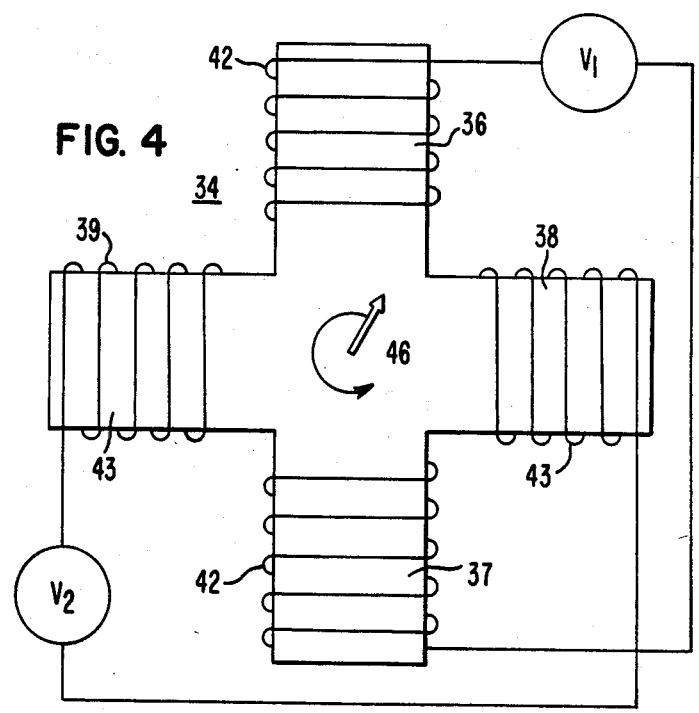
FIG. 4 is an electrical diagram serving to illustrate the concept of the present invention.
Figure 6:
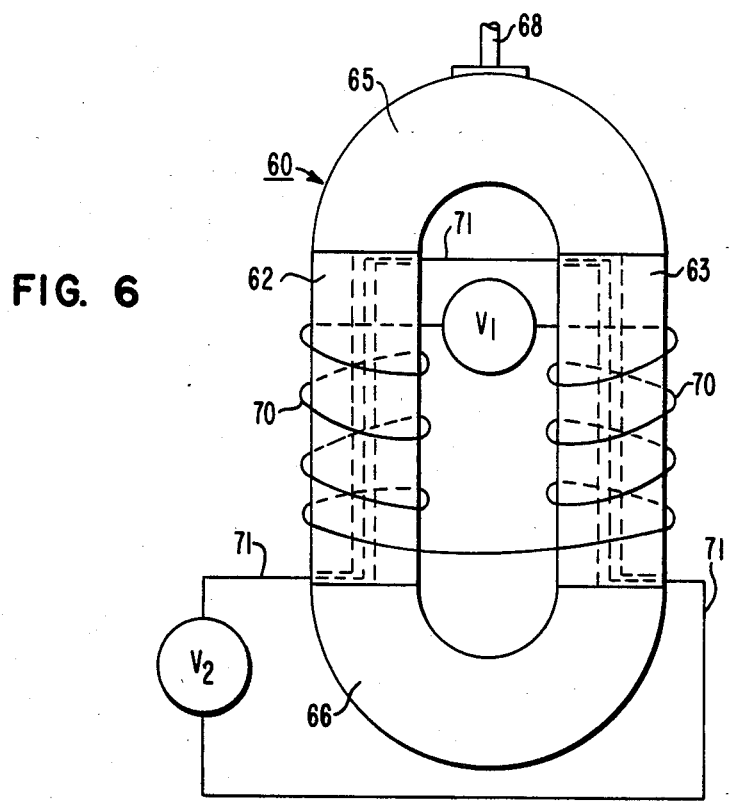
FIG. 6 illustrates one embodiment of the present invention.

FIG. 4 is presented to illustrate the basic concept of operation involved with the improved transducer to be described in FIG. 6. Magnetostrictive material is presented in the form of a cross 34 having north-south arms 36, 37 and east-west arms 38, 39.

Coil 42 is wrapped around the north-south arms 36, 37 and is connected to a first source of AC signal, $V_1$. Coil 43, having the same number of turns as coil 42, is wrapped around the east-west arms 38, 39 and is connected to a second source of AC signal, $V_2$. The two AC signals are of equal magnitude and are 90° out-of-phase with respect to one another and in a typical embodiment may be sinusoidal signals of the form $V_1 = V_0 \sin wt$ and $V_2 = V_0 \sin (wt + 90°)$.

A magnetic induction vector 46 is induced in the central part of the cross 34, and with the given phase relationships between the two AC sources this vector will continuously rotate as opposed to conventional transducers wherein the magnetic induction vector merely changes amplitude and direction along the same straight line in response to a sinusoidal signal. Regardless of the type of magnetic material or any preferred orientation, the rotating vector concept ensures magnetostrictive action by 90° wall movement and/or domain rotation, depending upon the degree of saturation.

Figure 5:
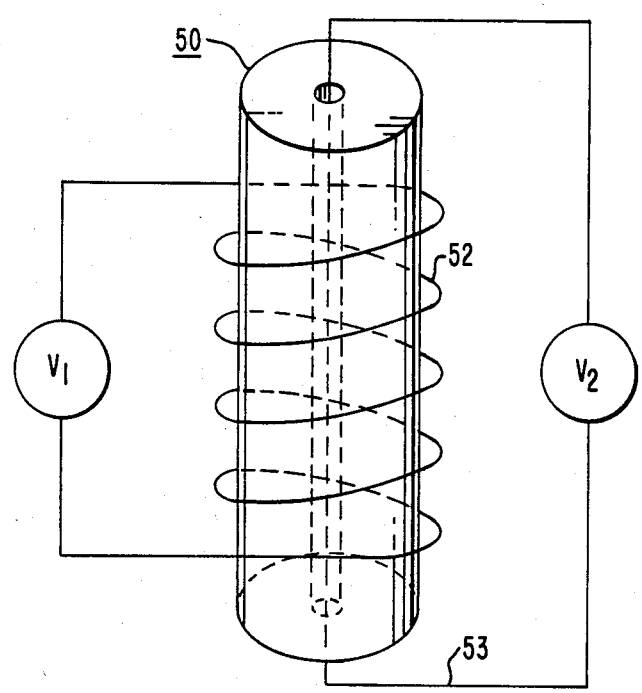
FIG. 5 illustrates an alternate arrangement to FIG. 4.

In FIG. 5 the entire magnetic core in the form of a cylinder 50 can participate in magnetostrictive action as opposed to only the central part of the cross of FIG. 4. Coil 52 is wound around the outside of the cylinder and connected to a voltage source $V_1$ while coil 53 (shown only as a single wire for clarity) is connected to a second AC source $V_2$ with the sources being 90° out-of-phase with respect to one another as in FIG. 4. Current in the outer coil, if acting alone, generates flux lines along the axial direction of the cylinder while current in the inner coil, if acting alone, generates flux lines in the form of concentric circles about the cylinder axis. The flux lines or induction vectors are the result of these two components which are 90° apart spatially as well as in their electrical phase. This leads to resultant rotating induction vectors throughout the core material.

A practical magnetostrictive transducer embodiment utilizing the concepts of FIG. 5 is illustrated in FIG. 6. The transducer 60 includes first and second arms 62 and 63, each of cylindrical form with their longitudinal axes parallel to one another.

First and second yokes 65 and 66 are connected to the ends of the arms to act as flux conducting members and a coupling means 68 is connected to one of the yokes, 65, for transfer of magnetostrictive movement in a desired utilization device.

A first coil 70 is wound about both arms 62 and 63 and is connected to a first signal source $V_1$. A second coil 71, comprising one or more windings, is threaded through central apertures in both of the arms 62 and 63 and is connected to a second signal source $V_2$.

By way of example, arms 62 and 63 may be of a particulate material such as various ferrites which may be cast directly into the shape of a cylinder. A material having a low or zero anisotrophy may be preferred since such materials are easily saturated, one example being an amorphous metal which is a non-crystalline metal. This latter material is fabricated and is commercially available in thin sheets and for the embodiment of FIG. 6 the sheets may be rolled into cylindrical form, as in FIG. 7, for use as the magnetostrictive arms 62 and 63.

In one embodiment the signal sources $V_1$ and $V_2$ are AC signals such as sine waves 74 and 75 illustrated in FIG. 8. As previously discussed, these signals are 90° out-of-phase with respect to one another. The consequence of this arrangement is illustrated in FIG. 9 wherein numeral 76 defines an imaginary plane tangent to point P representing any point on the surface of the sheet illustrated in FIG. 7. The elemental plane 76 is so small such that the plane is coincident with the sheet material itself. With the relationship between the applied signals, a magnetic induction vector 78 is generated and rotates a full 360° around point P.

The same magnetostrictive effect can be achieved with an arrangement wherein the magnetic induction and vector rotates through an angle less than 360°. The waveforms required for this operation are illustrated by way of example in FIG. 10. Source $V_1$ supplying the coils wrapped around the arms of the transducer may be the same sine wave 74 as previously described. Source $V_2$, however, provides a DC signal represented by constant waveform 80 in FIG. 10. With such an arrangement, and as illustrated in FIG. 11, the magnetic induction vector 82 will oscillate between a positive vertical and a negative vertical position and in so oscillating will rotate through a predetermined angle $\alpha$ equal to or somewhat less than 180°. In this latter mode of operation the non-DC source $V_1$ may be easily designed to provide other than a sinusoidal waveform. In this manner custom tailored or information containing signals may be both transmitted and received by the transducer.

Figure 12:
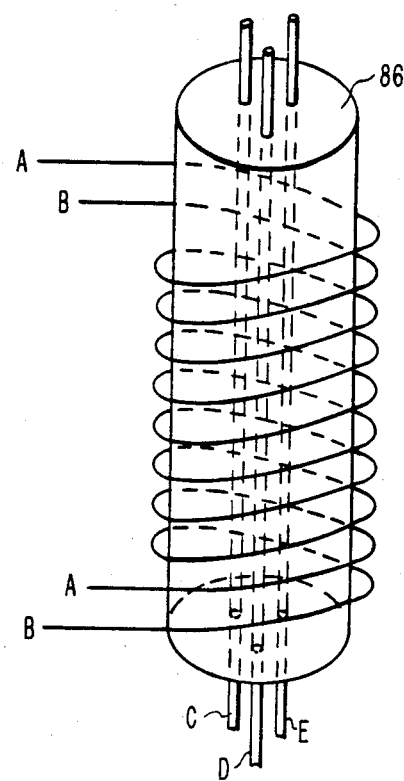
FIG. 12 illustrates an alternate embodiment of the invention for use with a three-phase source.

Various applications requiring magnetostrictive transducer action have a three-phase signal source at their disposal as opposed to a two-phase source which has been described. The transducer of the present invention is equally operable with such three-phase source and one typical three-phase arrangement is illustrated by way of example in FIG. 12 wherein for clarity only one arm, of a dual arm arrangement as in FIG. 6, has been illustrated.

Figure 13:
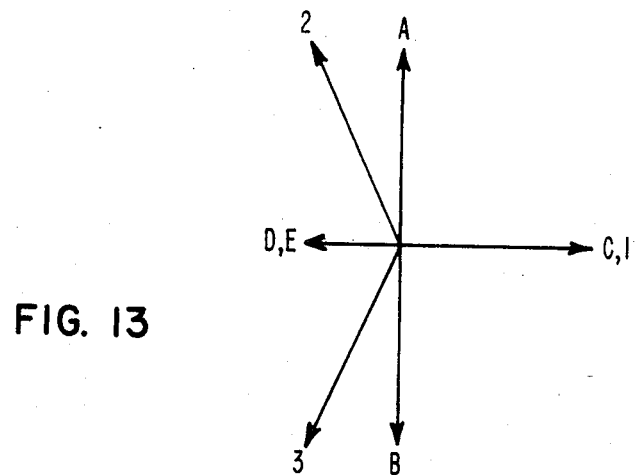
FIG. 13 is a phasor diagram associated with FIG. 12.

Five coils are illustrated and have been designated A, B, C, D and E. Coils A and B have an equal number of turns and are wound about arm 86 and are connected with opposite polarities as indicated in the phasor diagram of FIG. 13 by the vectors A and B. Coil C passing through the center of the arm constitutes phase 1 of the three-phase system. Coils D and E also pass through the center of the arm and have fewer terms and are of opposite polarity to coil C, as indicated in the phasor diagram. The second phase of the three-phase source is constituted by the series connection of coils A and D while phase three is constituted by the series connection of coils B and E.

Accordingly, a magnetostrictive transducer arrangement has been described wherein magnetostrictive materials may be used which normally would not be used due to the difficulty in establishing a preferred direction. Regardless of the materials selected, operation may take place at less than saturation conditions, or preferably at saturation wherein any domain wall movement is minimized or eliminated, thus substantially reducing any eddy current losses within the material and essentially eliminating all hysteresis losses.

We claim:

1. A magnetostrictive transducer comprising:
   (A) an assembly including magnetostrictive material having one or more magnetic domains;
   (B) electrical means for establishing a varying magnetic field of a type to generate, within said magnetostrictive material, a magnetic induction which rotates to induce magnetostrictive domain movement, and
   (C) mechanical coupling means connected to said assembly for transfer of magnetostrictive movement of said material.

2. Apparatus according to claim 1 wherein:
   (A) said electrical means is such that said magnetic induction rotates cyclically through 360°.

3. Apparatus according to claim 2 wherein:
   (A) said electrical means includes first and second electrical windings coupled to said magnetostrictive material;
   and which includes
   (B) means for respectively applying first and second AC signals to said first and second windings;
   (C) said AC signals being 90° out-of-phase with respect to each other.

4. Apparatus according to claim 3 wherein:
   (A) said AC signals are sinusoidal.

5. Apparatus according to claim 3 wherein:
   (A) said AC signals are of a magnitude to cause magnetic saturation of said magnetostrictive material whereby the resulting single magnetic domain rotates in response to said signals.

6. Apparatus according to claim 1 wherein:
   (A) said electrical means is such that said magnetic induction oscillates spatially through an angle $\alpha \leq 180°$.

7. Apparatus according to claim 6 wherein:
   (A) said electrical means includes first and second electrical windings coupled to said magnetostrictive material;
   and which includes
   (B) means for applying an AC signal to said first winding; and
   (C) means for applying a DC signal to said second winding.

8. Apparatus according to claim 7 wherein:
   (A) said AC signal is sinusoidal.

9. Apparatus according to claim 1 wherein:
   (A) said assembly includes first and second arms of magnetostrictive material.

10. Apparatus according to claim 9 wherein:
    (A) said arms are parallel to one another.

11. Apparatus according to claim 9 wherein:
    (A) said arms are cylindrical.

12. Apparatus according to claim 11 wherein:
    (A) said arms are formed of rolled-up sheets of magnetostrictive material.

13. Apparatus according to claim 9 which includes:
    (A) magnetic flux conducting yoke means connecting said first and second arms.

14. Apparatus according to claim 13 wherein:
    (A) said mechanical coupling means is connected to said yoke means.

15. Apparatus according to claim 9 which includes:
    (A) a first electrical winding wound about said first and second arms;
    (B) a second electrical winding passing axially through said first and second arms;
    (C) means for respectively applying first and second AC signals to said first and second windings;
    (D) said AC signals being 90° out-of-phase with respect to each other.

16. Apparatus according to claim 9 which includes:
    (A) a first electrical winding wound about said first and second arms;
    (B) a second electrical winding passing axially through said first and second arms;
    (C) means for applying an AC signal to said first winding; and
    (D) means for applying a DC signal to said second winding.

17. Apparatus according to claim 14 which includes:
    (A) a source of three-phase electrical energy;
    (B) a first plurality of electrical windings wound about said first and second arms;
    (C) a second plurality of electrical windings passing axially through said first and second arms;
    (D) said first and second plurality of electrical windings being connected to said source of three-phase electrical energy.

18. Apparatus according to claim 9 which includes:
    (A) a source of three-phase electrical energy;
    (B) first and second electrical windings wound about said first and second arms;
    (C) third, fourth and fifth windings passing axially through said first and second arms;
    (D) said first and second windings having an equal number of turns;
    (E) said third winding being connected to one phase of said source;
    (F) said first and fourth windings being series connected to another phase of said source; and
    (G) said second and fifth windings being series connected to the third phase of said source.

* * * * *